(12) United States Patent
Park et al.

(10) Patent No.: US 6,504,407 B2
(45) Date of Patent: Jan. 7, 2003

(54) PROGRAMMABLE HIGH SPEED FREQUENCY DIVIDER

(75) Inventors: Hong-june Park, Kyungsangbuk-do (KR); Sang-hoon Lee, Kyungsangbuk-do (KR)

(73) Assignee: Pohang University of Science and Technology Foundation, Kyungsangbuk-do (KR)

( * ) Notice: Subject to any disclaimer, the term of this patent is extended or adjusted under 35 U.S.C. 154(b) by 0 days.

(21) Appl. No.: 09/950,817

(22) Filed: Sep. 13, 2001

(65) Prior Publication Data

US 2002/0036935 A1 Mar. 28, 2002

(51) Int. Cl.⁷ .......................... H03K 21/34; H03L 7/18
(52) U.S. Cl. ....................................... 327/115; 377/110
(58) Field of Search ................................ 377/110, 111, 377/52; 327/115, 113, 114, 117

(56) References Cited

U.S. PATENT DOCUMENTS

| | | | | |
|---|---|---|---|---|
| 3,774,056 A | * | 11/1973 | Sample et al. | 307/293 |
| 4,296,380 A | * | 10/1981 | Minakuchi | 328/48 |
| 4,741,004 A | * | 4/1988 | Kane | 377/110 |

* cited by examiner

*Primary Examiner*—Dinh T. Le
(74) *Attorney, Agent, or Firm*—Leydig, Voit & Mayer, Ltd.

(57) ABSTRACT

A programmable high speed frequency divider, in which flip-flops for forming a frequency divider which is capable of being programmed with a programmable dividing ratio is simplified increase the speed of the frequency divider. By simplifying the least significant bit flip-flops, including the flip-flop representing the least significant bit, among flip-flops forming a frequency divider, the speed of the counter in the frequency divider is increased and the frequency limit of an input clock which can be divided is raised.

3 Claims, 5 Drawing Sheets

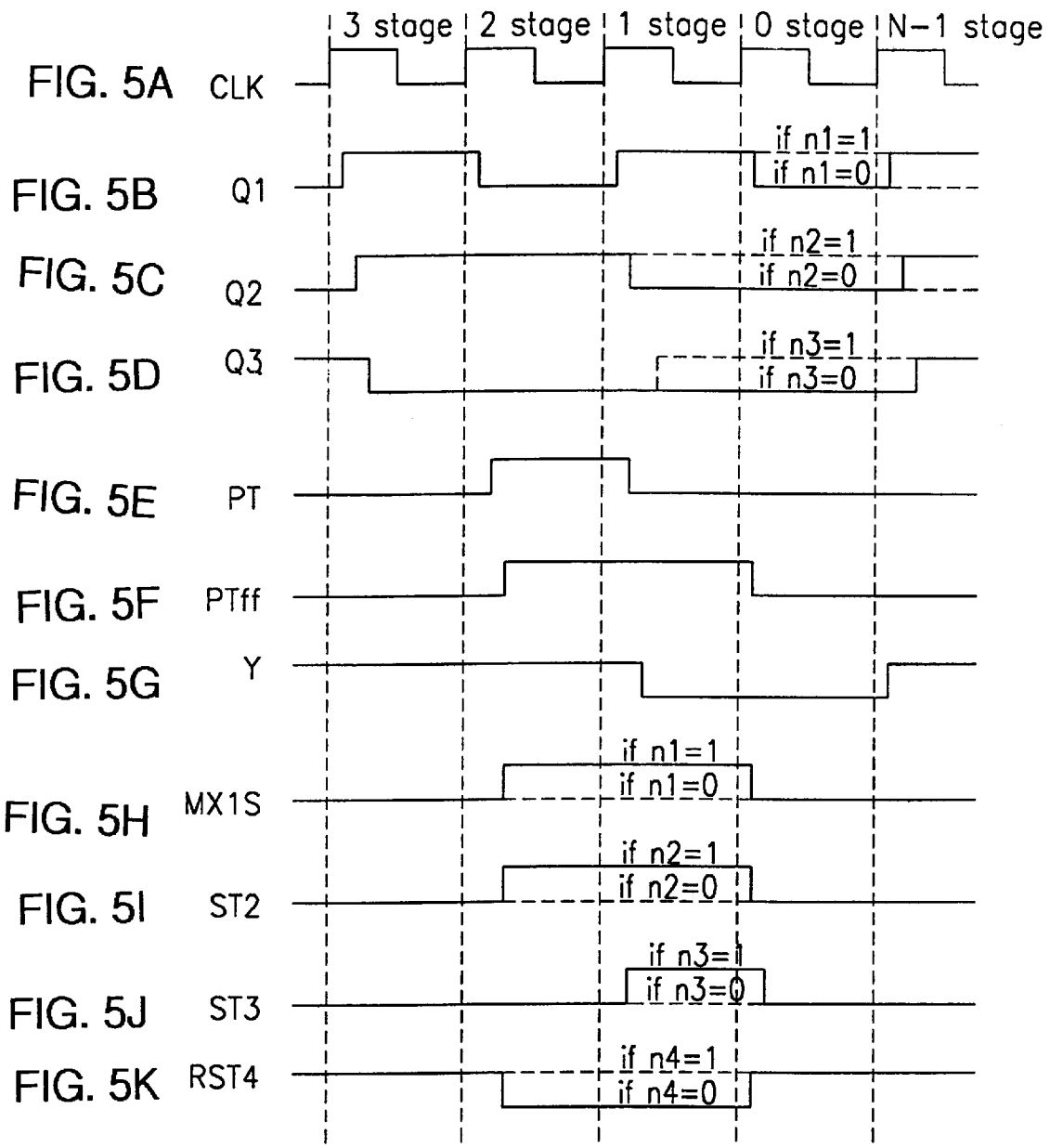

PROGRAMMABLE HIGH SPEED FREQUENCY DIVIDER

BACKGROUND OF THE INVENTION

1. Field of the Invention

The present invention relates to a frequency divider, and more particularly, to a programmable high speed frequency divider capable of programming the dividing ratio of an input clock frequency, in which the construction of flip-flops for forming the frequency divider is simplified in order to increase the operation speed of the frequency divider.

2. Description of the Related Art

Generally, in order to generate a signal of a desired frequency by using a clock signal in an electronic circuit, a circuit for dividing a clock signal frequency by an arbitrary natural number N is needed. This circuit is referred to as a frequency divider.

Here, N is a natural number equal to or greater than 2 and its maximum value differs depending on the number of bits in an implemented counter. Generally in a k-bit counter, N is set to be a value within a range defined by the following equation 1:

$$2 \leq N \leq 2^k - 1 \qquad (1)$$

FIG. 1 is a circuit diagram of a prior art 6-bit counter which is used in a frequency divider. Because k is 6, the counter has 6 flip-flops, each having a set function and a reset function.

A clock signal which is desired to be divided is input to flip-flop (FF11) representing the least significant bit. The counter has an asynchronous structure in which the output signal of a flip-flop is the clock input of the next digit flip-flop. When a clock signal passes through bit-by-bit from the least significant bit to the most significant bit, the output frequency of each flip-flop decreases by half.

When the dividing ratio of an input clock signal is set to N, flip-flops (FF11–FF16) forming the counter are initialized to represent N by signals st1 through st6 and rst1 through rst6 which are generated in a control circuit 10. For example, if N is 19, i.e., the binary number 010011, the six flip-flops (FF11–FF16) are set to represent the bits of the binary number in reverse order, i.e., the six flip-flops (FF11–FF16) are set to represent the bits 1, 1, 0, 0, 1, 0, respectively. To set a flip-flop to '1', a set signal is applied to the flip-flop, and to set the flip-flop to '0', a reset signal is applied to the flip-flop.

Whenever a clock signal is applied to the flip-flop representing the least significant bit (FF11), the number represented by the 6-bit counter (FF11–FF16) decreases gradually. If the number represented by the 6-bit counter (FF11–FF16) becomes '0', N is again loaded into the flip-flops of the counter by a set or reset signal, and counting is carried out in the decreasing direction.

When N is loaded, a signal having a predetermined cycle is generated by the control circuit 10 of the counter. The generated frequency of this signal is the value obtained by dividing an input clock signal frequency by N.

FIG. 2 is a logic circuit diagram of the control circuit 10 for generating a set signal and a reset signal for loading N to flip-flops (FF11–FF16) of the counter shown in FIG. 1.

As shown in FIG. 2, the control circuit 10 includes one flip-flop (FF17) and a plurality of NAND gates (G13 and G14) and NOR gates (G11–G15). The function of a circuit formed by the NAND gates and NOR gates is receiving the outputs of the six flip-flops (FF11–FF16) and determining whether or not the value represented by the counter and taken from the flip-flop representing the most significant bit to the flip-flop representing the least significant bit of the counter is '000010'. If the counter represents '000010', the circuit provides '1' to the D input terminal of flip-flop FF17, and if not, the circuit provides '0'.

The output of flip-flop FF17 is fed back to NAND gate G14 in order to avoid providing an incorrect logical value to flip-flop FF17 due to delay time by a logic circuit. Then, using the output signal of flip-flop FF17, the control circuit 10 generates set signals and reset signals for the respective flip-flops (FF11–FF16) forming the counter. For example, when a non-inverted output of flip-flop FF17 is '1', if a value to be loaded in an arbitrary flip-flop of the counter is '1', '1' is provided as a set signal for the flip-flop and '0' is provided as a reset signal for the flip-flop. However, if a value to be loaded in an arbitrary flip-flop of the counter is '0', '0' is provided as a set signal for the flip-flop and '1' is provided as a reset signal for the flip-flop.

In this way, in the counter used in a frequency divider, flip-flop FF11, which is located in the least significant bit among six flip-flops, operates at the highest frequency, and as the signal passes through the flip-flops to the flip-flop in the most significant bit, the maximum operating frequency decreases by half at each flip-flop. Therefore, flip-flops operating at higher frequencies must have simpler structures so they can operate at high speed.

However, according to the structure of a prior art counter used in a frequency divider, all flip-flops, including the flip-flop representing the least significant bit, are loaded with a desired dividing ratio using set signals and reset signals. As a result, the structure of the flip-flop representing the least significant bit is complex, the operating speed is relatively low, and therefore it is difficult to divide a clock signal with a higher frequency.

SUMMARY OF THE INVENTION

To solve the above-described problems, it is an objective of the present invention to provide a programmable high speed frequency divider, in which for flip-flop representing the least significant bit among flip-flops forming a counter, the flip-flop having a simple structure, which does not use a set signal and a reset signal, is used in order to increase the operating speed of the frequency divider.

To accomplish the objective of the present invention, there is provided a programmable high speed frequency divider having a counter in which a clock signal desired to be divided is applied to the clock terminal of the first flip-flop representing the least significant bit; the output terminal of the flip-flop representing the least significant bit is connected to the clock terminal of the second flip-flop representing the next least significant bit, and the next flip-flops are connected in the same manner through to the highest effective digit flip-flop; the set terminal and reset terminal of the first flip-flop are open and a logical operation result of control signals and output signals of the flip-flops is applied to the input terminal of the first flip-flop; and all the flip-flops except the first flip-flop are initialized with cycles corresponding to a dividing ratio by set signals or reset signals; and a control circuit which receives the outputs of the flip-flops forming the counter, generates control signals corresponding to counting values of the counter with a predetermined logic gate circuit, and generates set signals and reset signals for initializing flip-flops forming the counter with cycles corresponding to the dividing ratio.

BRIEF DESCRIPTION OF THE DRAWINGS

The above objects and advantages of the present invention will become more apparent by describing in detail preferred embodiments thereof with reference to the attached drawings in which:

FIGS. 5A through 5K are timing diagrams of the variety of control signals, and set and reset signals of flip-flops shown in FIGS. 3 and 4.

DESCRIPTION OF THE PREFERRED EMBODIMENTS

For convenience of explanation, it is assumed that a 6-bit down-counter having 6 flip-flops is used in a preferred embodiment of the present invention.

Figure 1:
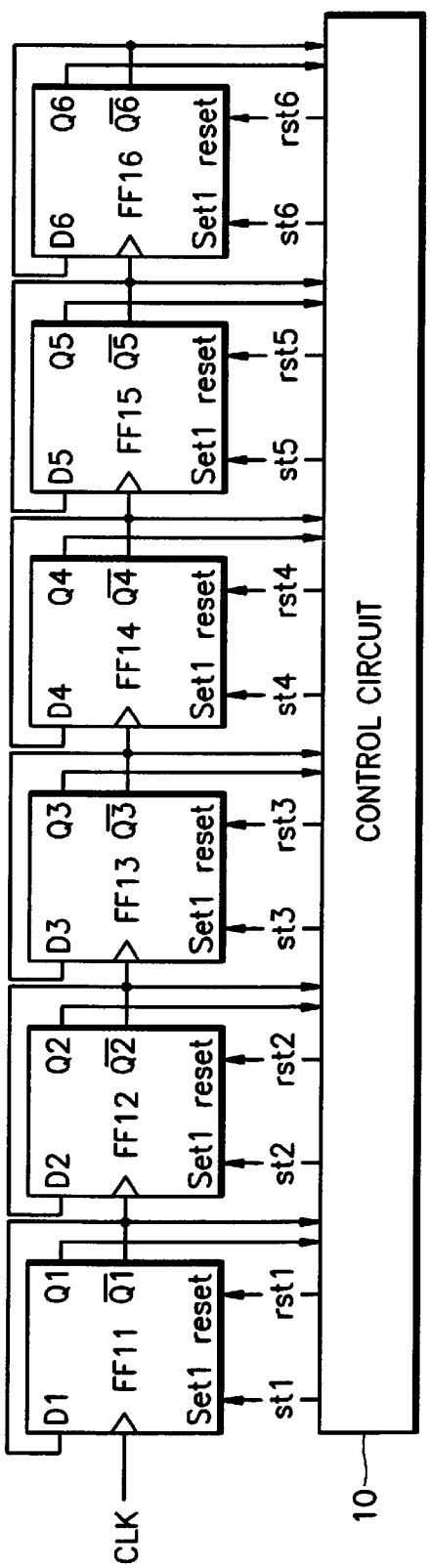
FIG. 1 is a schematic diagram of a prior art programmable frequency divider.
Figure 2:
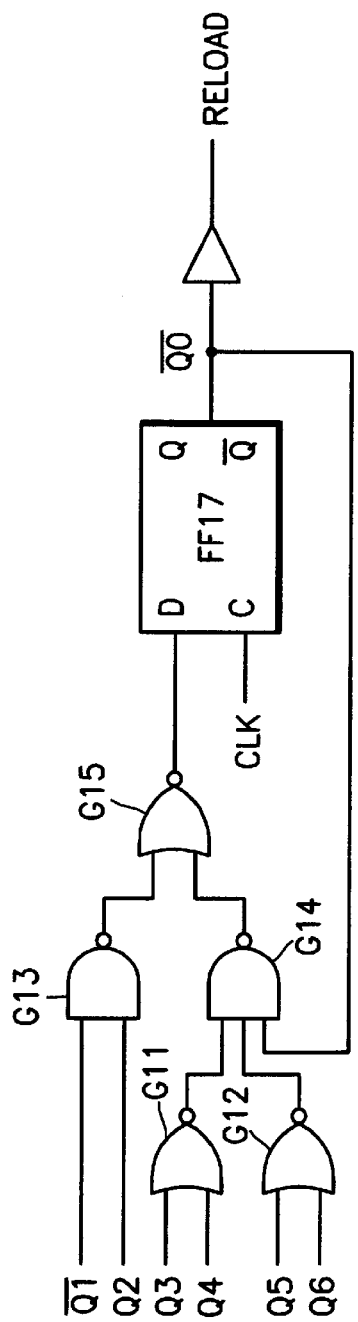
FIG. 2 is a logic circuit diagram of the control circuit for loading a set signal and a reset signal into flip-flops of the counter shown in FIG. 1.
Figure 3:
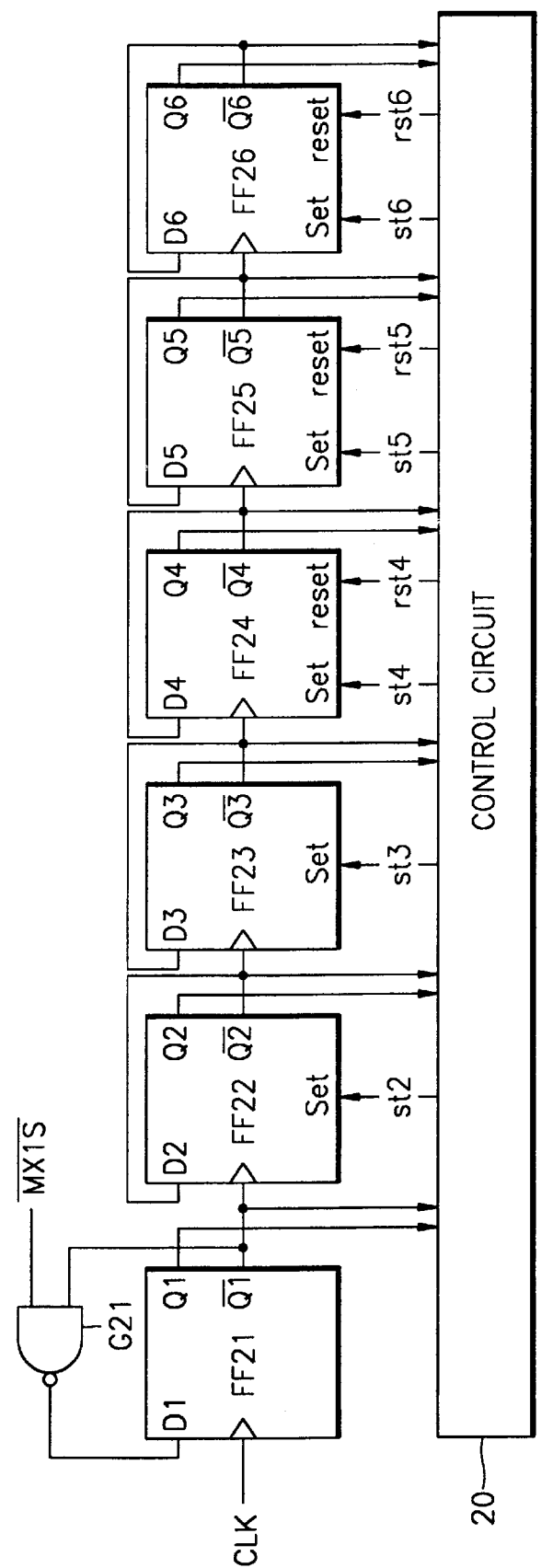
FIG. 3 is a schematic diagram of a preferred embodiment of a programmable high speed frequency divider according to the present invention.

As shown in FIG. 3, a programmable high speed frequency divider according to the present invention includes a counter and a control circuit 20. The counter is formed with 6 flip-flops (FF21–FF26) and a NAND gate (G21).

A clock signal which is desired to be divided is input to a flip-flop (FF21) representing the least significant bit. The counter has an asynchronous structure in which the output signal of a flip-flop is the clock input of flip-flop representing the next higher bit. When a clock signal progressively passes bit-by-bit from the least significant bit to the most significant bit, the output frequency of each flip-flop decreases by half.

Except the flip-flop (FF21) representing the least significant bit, each flip-flop (FF22–FF26) has a structure in which a non-inverted output of the flip-flop is fed back to the D input terminal of the flip-flop and an inverted output of the flip-flop is provided to the control circuit 20. A signal output from a NAND gate G21 to which $\overline{MX1S}$ generated in the control circuit 20 and an inverted output signal of the flip-flop (FF21) representing the least significant bit are input, is input to the D input terminal of the flip-flop (FF21).

In the control circuit 20, the logic circuits of FIGS. 4A through 4H generate set signals (st2 and st3) for flip-flop representing the second least significant bit and flip-flop representing the third least significant bit (FF22 and FF23), set signals (st4, st5, and st6) and reset signals (rst4, rst5, and rst6) for flip-flops (FF24–FF26), and a variety control signals (PT, PTff, Y, and MX1S).

Referring to the logic circuits of FIGS. 4A through 4H and FIGS. 5A through 5K, the generation of a variety of control signals, set signals and reset signals will now be explained.

Figure 4A:
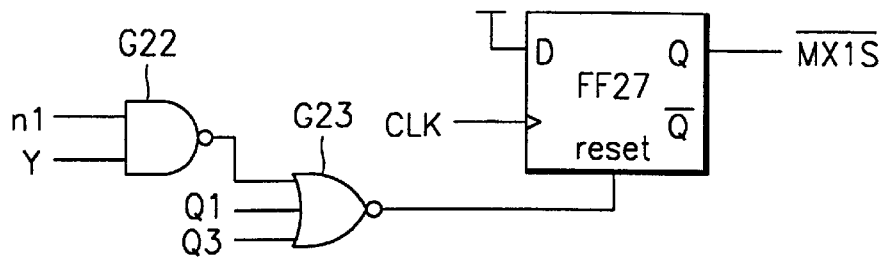
FIGS. 4A through 4H are schematic diagrams of logic circuits for generating a variety of control signals in the control circuit shown in FIG. 3 and for generating set and reset signals for flip-flops forming the counter shown in FIG. 3.
Figure 4B:
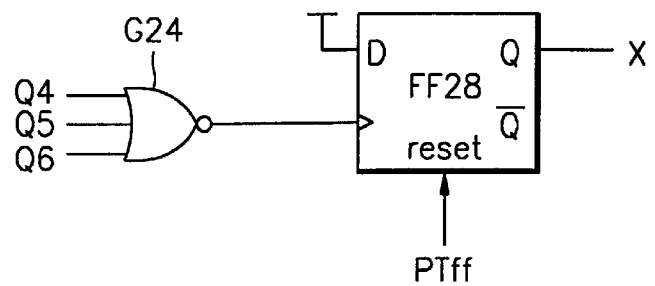
Figure 4C:
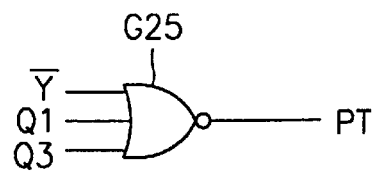
Figure 4D:
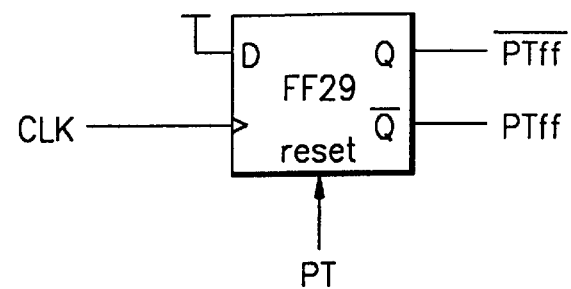
Figure 4E:
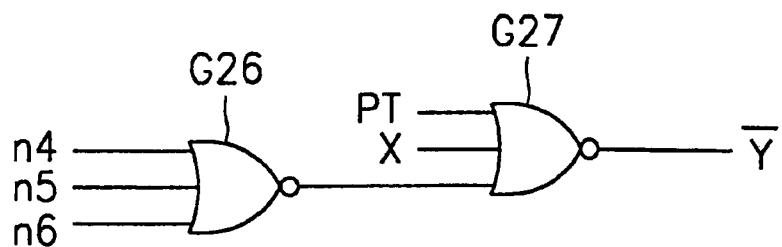
Figure 4F:
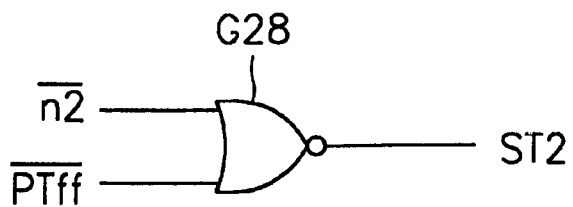

In FIG. 4F, if n4, n5, or n6 is input to NOR gate G28 instead of n2, the output is ST4, ST5, or ST6, respectively, instead of ST2. In FIG. 4H, if n5 or n6 is input to NAND gate G30 instead of n4, the output is RST5 or RST6, respectively, instead of RST4.

Here, when N, the divisor of frequency division, is expressed as a binary number, n1, n2, n3, n4, n5, and n6, each of which is a binary '1' and '0', represent the binary number from the least significant bit to the most significant bit.

FIGS. 5A through 5K are timing diagrams in previous stages 3, 2, 1, 0, and N-1 of a clock signal (CLK), the outputs Q1, Q2, and Q3 of flip-flops (FF21, FF22, and FF23), and a variety of control signals. In stage 0, an initial value (N) is loaded into the flip-flops of the counter when a clock signal is provided.

As shown in the timing diagrams, in stage 0, flip-flops FF21, FF22, and FF23 are initialized with values corresponding to the lowest 3 bits of N (n1, n2, and n3) by the logic circuits of FIGS. 4A through 4H, and the values Q1, Q2, and Q3 are determined. Then, as a clock signal is applied in stage N-1, down-counting is sequentially carried out.

This process will now be explained in more detail. First, the signal PT, which is a control signal, is designed so as to convert '0' to '1' when the value represented by the counter and taken from the most significant bit to the least significant bit is '0000X0'. Then, as shown in FIG. 4D, since the inverted output of flip-flop FF29 is the signal PTff and the reset input of flip-flop FF29 is the signal PT, PTff becomes '1' after a predetermined time. If N is an odd number, i.e., n1 is '1', MX1S becomes '1' by the logic circuit of FIG. 4A, and if N is an even number, i.e., n1 is '0', MX1S remains as '0'.

Figure 4G:
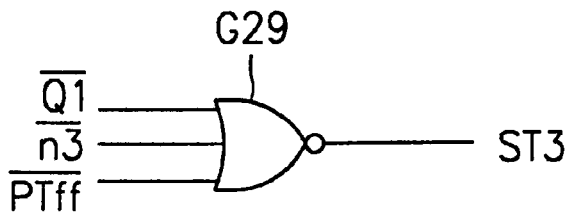
Figure 4H:
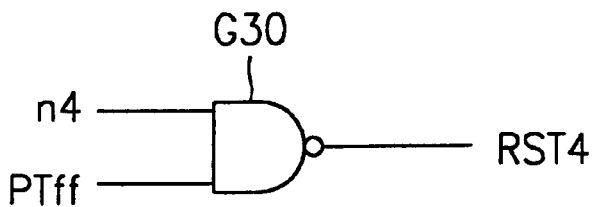

If PTff value is determined, signal values of ST2, ST4, ST5, ST6, RST4, RST5, and RST6 are determined depending on n2, n4, n5, and n6, by the logic circuits of FIGS. 4F through 4H.

For example, if PTff is '1' and n2, n4, n5, and n6 are binary '1010', ST2 is '1', ST4 is '0', ST5 is '1', ST6 is '0', RST4 is '1', RST5 is '0', and RST6 is '1'. As for ST3, if Q3 is set in an interval of stage 2, an interval in which the signal PT remains '1' may be shorter than one cycle and, therefore, ST3 is set by a different method. That is, as in the logic circuit of FIG. 4G, in order to make ST3 '1', Q1, PTff and n3 should be '1'.

In order to make the flip-flop FF21 representing the least significant bit remain '1' without generating a set signal, NAND gate G21 is placed on a path where the output of flip-flop FF21 is fed back as an input. By using the inverted signal of the signal MX1S as an input signal of NAND gate G21, the flip-flop FF21 is implemented by a flip-flop having the simplest structure.

In stage 1, if MX1S is '1', '1' can be fed back instead of '0' where '0' is fed back, and therefore the flip-flop FF21 can be set.

Due to delays in the control logic circuits of FIGS. 4A through 4H, PT may be '1' again in stage 0 after PT becomes '1' in stage 2, and '0' in stage 1.

This is because 3 most significant bits (Q4–Q6) as well as Q1 and Q3 should be used to determine PT, and it takes a time to determine whether PT becomes '1' or '0' by using 3 most significant bits. Though Q1 is '1' in stage 1 and PT temporarily becomes '0', unless it is known by stage 0 that the most significant bits are still all '0' or any one of the most significant bits is '1', PT can be '1' again if Q1 is '0' in stage 0, though all the most significant bits are not '0'.

A logic circuit for preventing PT errors by using the signal Y generated by the logic circuit of FIG. 4E in order to avoid the occurrence of the above-described wrong determination is shown in FIG. 4C. Since the signal Y is unconditionally '0' in stage 1 and stage 0 if N is a number equal to or greater than 8, PT unconditionally becomes '0'. However, if N is a number equal to or less than 7, not any of Q4, Q5, and Q6 is set to '1'. Accordingly, wrong determination of PT due to delays in the logic circuits described above does not occur and at this time Y is maintained at '1'. Y should be '0' in an interval where PT is '0', Y should be '0' only when N is equal to or greater than 8, and the intervals should be stage 1 and stage 0. To satisfy these three conditions, a signal X is generated by the logic circuit of FIG. 4 B. Signal X is a signal which is '1' when Q4, Q5, and Q6 are all '0', and is '0' when PTff is '1'.

As this, the simplest flip-flop having no set and reset signals is used for flip-flop representing the least significant bit, which operates at the fastest speed among flip-flops forming the counter in the frequency divider. Flip-flops, each having only a set signal, are used for flip-flops representing the next two bits. By making these flip-flops have simpler structures than flip-flops representing the most significant bits, which have both set and reset signals, the overall operation speed is increased.

The frequency divider according to the present invention has recorded a speed which is approximately 1.83 times faster than a prior art frequency divider in a simulation after laying-out using HSPICE.

According to the present invention as described above, by simplifying the structures of flip-flops representing the least significant bits, including the flip-flop representing the least significant bit, among flip-flops forming a frequency divider, the operating speed of the counter is increased and the frequency limit of an input clock which can be divided is raised.

Optimum embodiments have been explained in the drawings and specification, and though specific terminologies are used here, they are only used to explain the present invention. Therefore, the present invention is not restricted to the above-described embodiments and many variations are possible within the spirit and scope of the present invention. The scope of the present invention is not determined by the description but by the accompanying claims.

What is claimed is:

1. A programmable high speed frequency divider comprising:

a counter including a plurality of flip-flops, each flip-flop having a clock terminal, an input terminal, an output terminal, a set terminal, and a reset terminal, and in which a clock signal to be divided is applied to the clock terminal of a first flip-flop of the plurality of flip-flops, representing a least significant bit, wherein
the output terminal of the first flip-flop representing the least significant bit is connected to the clock terminal of a second flip-flop of the plurality of flip-flops, representing the next least significant bit;
remaining flip-flops are similarly connected through a most significant bit flip-flop;
the set terminal and reset terminal of the first flip-flop are open and a logical operation result of control signals and output signals of the flip-flops is applied to the input terminal of the first flip-flop; and
the plurality of flip-flops, except the first flip-flop, are initialized by set signals or reset signals corresponding to a dividing ratio; and a control circuit which receives outputs of the plurality of flip-flops, generates control signals corresponding to counting values of the counter with a logic gate circuit, and generates set signals and reset signals for initializing flip-flops of the counter and having frequencies corresponding to the dividing ratio.

2. The programmable high speed frequency divider of claim 1, wherein the second and third flip-flops representing the second and third least significant bits have open reset terminals and are initialized by set signals applied to their set terminals.

3. The programmable high speed frequency divider of claim 1, wherein the flip-flops are D flip-flops.

* * * * *